(12) United States Patent
Ono et al.

(10) Patent No.: US 10,651,132 B2
(45) Date of Patent: May 12, 2020

(54) SEMICONDUCTOR DEVICE (71) Applicant: TOSHIBA MEMORY CORPORATION, Tokyo (JP)

(72) Inventors: Yoshitaka Ono, Yokohama Kanagawa (JP); Masamitsu Oshikiri, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/113,328

(22) Filed: Aug. 27, 2018

(65) Prior Publication Data
US 2019/0198452 A1    Jun. 27, 2019

(30) Foreign Application Priority Data
Dec. 27, 2017  (JP) .................. 2017-250328

(51) Int. Cl.
| | | |
|---|---|---|
| *H01L 23/00* | (2006.01) | |
| *H01L 25/065* | (2006.01) | |
| *H01L 23/16* | (2006.01) | |
| *H01L 23/31* | (2006.01) | |

(52) U.S. Cl.
CPC ............ *H01L 23/562* (2013.01); *H01L 23/16* (2013.01); *H01L 23/3135* (2013.01); *H01L 23/564* (2013.01); *H01L 25/0652* (2013.01); *H01L 25/0657* (2013.01); *H01L 23/3128* (2013.01); *H01L 2225/0651* (2013.01); *H01L 2225/06506* (2013.01); *H01L 2225/06562* (2013.01); *H01L 2225/06575* (2013.01); *H01L 2225/06582* (2013.01)

(58) Field of Classification Search
CPC . H01L 23/562; H01L 23/564; H01L 25/0652; H01L 25/0657; H01L 24/01; H01L 24/04; H01L 24/07
See application file for complete search history.

(56) References Cited

U.S. PATENT DOCUMENTS 6,054,337 A * 4/2000 Solberg ............... H01L 25/0657
                                                 257/E21.705
6,930,378 B1 * 8/2005 St. Amand .......... H01L 25/0657
                                                 257/685
8,569,870 B1 * 10/2013 Lee ....................... H01L 23/552
                                                 257/660

(Continued)

*Primary Examiner* — Earl N Taylor
(74) *Attorney, Agent, or Firm* — Kim & Stewart LLP (57) ABSTRACT

A semiconductor device includes a wiring board, a first semiconductor chip fixed to the wiring board and having a first surface film, a second semiconductor chip having a second surface film and positioned such that the first semiconductor chip is between the second semiconductor chip and the wiring board, a supporting plate between the first and second semiconductor chips, the supporting plate having a first surface and a second surface located on the side opposite to the first surface, the second surface facing the first semiconductor chip, and supporting the second semiconductor chip, a front surface layer on the first surface and formed of the same material as the second surface film, a spacer between the wiring board and the supporting plate, and a sealing resin that covers the second semiconductor chip and the supporting plate and contacts the second surface film and the front surface layer.

17 Claims, 7 Drawing Sheets

(56) References Cited

U.S. PATENT DOCUMENTS

| | | | | |
|---|---|---|---|---|
| 2002/0140073 A1* | 10/2002 | Pai | ............ | H01L 25/0657 257/686 |
| 2005/0104183 A1* | 5/2005 | Kuroda | ............ | H01L 25/18 257/686 |
| 2005/0184378 A1* | 8/2005 | Sasaki | ............ | H01L 23/16 257/686 |
| 2005/0194674 A1* | 9/2005 | Thomas | ............ | H01L 25/0657 257/690 |
| 2006/0151865 A1* | 7/2006 | Han | ............ | H01L 24/78 257/686 |
| 2007/0037321 A1* | 2/2007 | Higashino | ............ | H01L 23/3121 438/109 |
| 2007/0296087 A1* | 12/2007 | Ogata | ............ | H01L 23/3128 257/778 |
| 2008/0150093 A1* | 6/2008 | Jang | ............ | H01L 23/3128 257/659 |
| 2009/0001599 A1* | 1/2009 | Foong | ............ | H01L 25/0657 257/777 |
| 2010/0182744 A1* | 7/2010 | Hu | ............ | H01L 25/0657 361/679.54 |
| 2011/0163458 A1* | 7/2011 | Tsukano | ............ | H01L 23/3121 257/777 |
| 2013/0032942 A1* | 2/2013 | Sasaki | ............ | H01L 25/0657 257/738 |
| 2013/0037952 A1* | 2/2013 | Jung | ............ | H01L 25/0657 257/738 |
| 2013/0093103 A1* | 4/2013 | Kim | ............ | H01L 25/0657 257/777 |
| 2017/0047309 A1* | 2/2017 | Baek | ............ | H01L 25/0657 |
| 2017/0301654 A1* | 10/2017 | Frenette | ............ | H01L 25/0657 |
| 2017/0301655 A1* | 10/2017 | Frenette | ............ | H01L 25/16 |
| 2019/0198452 A1* | 6/2019 | Ono | ............ | H01L 23/562 |

* cited by examiner

FIG. 7

SEMICONDUCTOR DEVICE

CROSS-REFERENCE TO RELATED APPLICATION

This application is based upon and claims the benefit of priority from Japanese Patent Application No. 2017-250328, filed Dec. 27, 2017, the entire contents of which are incorporated herein by reference.

FIELD

Embodiments described herein relate generally to semiconductor devices.

BACKGROUND

There is a semiconductor device configured as one package in which a plurality of semiconductor chips is housed. For example, a plurality of semiconductor chips having different functions are housed in one package. The semiconductor chips having different functions sometimes have different sizes. When the semiconductor chips having different sizes are stacked and packaged, a supporting plate is provided between the semiconductor chips, for example, and some semiconductor chips are supported on the supporting plate.

Each semiconductor chip and the supporting plate in the package are covered with a sealing resin. If the adherence between the front surface of the semiconductor chip and the sealing resin or the adherence between the front surface of the supporting plate and the sealing resin is poor, water enters the interface between the semiconductor chip and the sealing resin or the interface between the supporting plate and the sealing resin. The water entering the interface expands by heat which is applied in a reflowing process at the time of implementation of the semiconductor device, for example. As a result of the water expanding at the interface, a crack may appear in the package. Moreover, expansion of the water at the interface may cause exfoliation of the sealing resin, resulting in a reduction in the humidity resistance of the semiconductor device and poor reliability.

DETAILED DESCRIPTION

Embodiments provide a semiconductor device that improves the adherence of a sealing resin.

In general, according to an embodiment, a semiconductor device includes A semiconductor device includes a wiring board; a first semiconductor chip that is fixed to the wiring board and has a first surface film on the front surface thereof, a second semiconductor chip having a second surface film on a front surface thereof and positioned such that the first semiconductor chip is between the second semiconductor chip and the wiring board, a supporting plate between the first semiconductor chip and the second semiconductor chip, the supporting plate having a first surface and a second surface which is located on the side opposite to the first surface, the second surface facing the first semiconductor chip, and supporting the second semiconductor chip on the side where the first surface is located, a front surface layer on the first surface and formed of the same material as the second surface film, a spacer between the wiring board and the supporting plate, and a sealing resin that covers the second semiconductor chip and the supporting plate and that contacts the second surface film and the front surface layer.

Hereinafter, embodiments will be described with reference to the drawings. In the following description, the same or similar elements will be identified with the same reference signs and descriptions of, for example, elements already explained will be omitted as appropriate.

Moreover, in the present specification, a term "on" "upper," "below," or "lower" is sometimes used for the sake of convenience. The term "on" "upper," "below," or "lower" is merely a term indicating the relative positional relationship in each drawing and does not define the positional relationship with respect to gravity.

Hereinafter, semiconductor devices of embodiments will be described with reference to the drawings.

First Embodiment

A semiconductor device of a first embodiment includes a wiring board, a first semiconductor chip that is fixed to the wiring board and has a first surface film on the front surface, a second semiconductor chip that is provided in such a way that the first semiconductor chip is placed between the second semiconductor chip and the wiring board, the second semiconductor chip having a second surface film on the front surface, a supporting plate that is provided between the first semiconductor chip and the second semiconductor chip, has a first surface and a second surface which is located on the side opposite to the first surface, the second surface facing the first semiconductor chip, and supports the second semiconductor chip on the side where the first surface is located, a spacer provided between the wiring board and the supporting plate, a front surface layer that is provided on the first surface and formed of the same material as the second surface film, and a sealing resin that covers the second semiconductor chip and the supporting plate and is in contact with the second surface film and the front surface layer.

Figure 1:
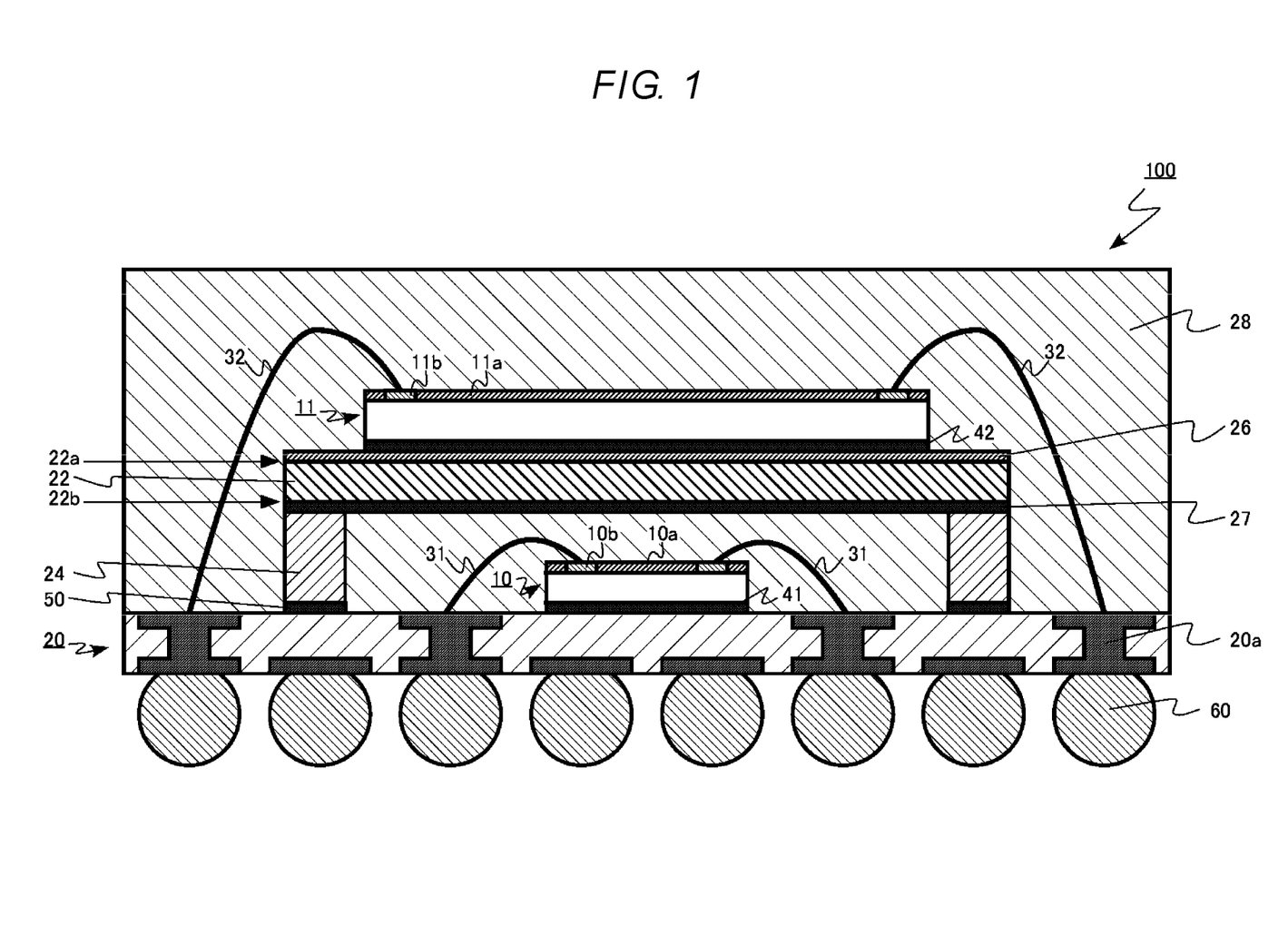
FIG. 1 is a schematic sectional view of a semiconductor device of a first embodiment.

FIG. 1 is a schematic sectional view of the semiconductor device of the first embodiment. The semiconductor device of the first embodiment is a semiconductor memory 100.

The semiconductor memory 100 includes a logic chip 10 (which may be referred to herein as the first semiconductor chip), a first memory chip 11 (which may be referred to herein as the second semiconductor chip), a printed circuit board 20 (which may be referred to herein as the wiring board), a supporting plate 22, a spacer 24, a front surface layer 26, a rear surface layer 27, a sealing resin 28, first bonding wires 31, second bonding wires 32, a first bonding layer 41, a second bonding layer 42, a fixing layer 50, and external terminals 60.

The semiconductor memory 100 is a multichip package (MCP) configured with two semiconductor chips housed in one package.

The logic chip 10 is fixed on the printed circuit board 20 by using the first bonding layer 41. The logic chip 10 has a first surface film 10a and an electrode pad 10b on the front surface.

The logic chip 10 has an arithmetic function. The logic chip 10 is, for instance, a memory controller chip that controls the first memory chip 11. The logic chip 10 is produced by using monocrystalline silicon, for example.

The first surface film 10a functions as a protective film of the logic chip 10. The first surface film 10a is an insulating film. The material of the first surface film 10a is, for example, a polyimide or silicon nitride. The material of the first surface film 10a may be, for instance, other insulators such as silicon oxide. The film thickness of the first surface film 10a is, for example, 200 nm or more but 5 μm or less.

The first bonding layer 41 is, for example, a resin layer. The first bonding layer 41 is, for example, a die attach film (DAF).

The printed circuit board 20 has a wiring layer 20a. The logic chip 10 and the printed circuit board 20 are electrically connected by the first bonding wires 31. One end of each first bonding wire 31 is connected to the electrode pad 10b and the other end is connected to the wiring layer 20a.

The first memory chip 11 is provided in such a way that the logic chip 10 is placed between the first memory chip 11 and the printed circuit board 20. The first memory chip 11 is fixed to the supporting plate 22 by using the second bonding layer 42. The first memory chip 11 has a second surface film 11a and an electrode pad 11b on the front surface.

The first memory chip 11 has a memory function. The first memory chip 11 is, for instance, a NAND flash memory. The first memory chip 11 is produced by using monocrystalline silicon, for example.

The size of the logic chip 10 is smaller than the size of the first memory chip 11. Here, the size means the chip area.

The second surface film 11a functions as a protective film of the first memory chip 11. The second surface film 11a is an insulating film. The material of the second surface film 11a is, for instance, a polyimide or silicon nitride. The material of the second surface film 11a may be, for example, other insulators such as silicon oxide. The film thickness of the second surface film 11a is, for instance, 200 nm or more but 5 μm or less.

The second surface film 11a is formed of the same material as the first surface film 10a, for example.

The second bonding layer 42 is, for instance, a resin layer. The second bonding layer 42 is, for example, a die attach film (DAF).

The supporting plate 22 is provided between the logic chip 10 and the first memory chip 11. The supporting plate 22 has a first surface 22a and a second surface 22b. The second surface 22b is located on the side opposite to the first surface 22a. The second surface 22b faces the logic chip 10. The supporting plate 22 has the function of supporting the first memory chip 11 on the side where the first surface 22a is located.

The material of the supporting plate 22 is, for example, a semiconductor. The material of the supporting plate 22 is, for instance, monocrystalline silicon. The material of the supporting plate 22 may be, for example, metal, ceramic, or resin.

On the first surface 22a of the supporting plate 22, the front surface layer 26 is provided. The front surface layer 26 is provided at least in part of the region of the first surface 22a. The front surface layer 26 is provided in, for example, a region of the first surface 22a in which the first memory chip 11 is not placed. As depicted in FIG. 1, for instance, the front surface layer 26 may be provided on the whole surface of the first surface 22a.

The front surface layer 26 has the function of improving the adherence between the sealing resin 28 and the supporting plate 22. The front surface layer 26 is formed of the same material as the second surface film 11a. The thickness of the front surface layer 26 is, for example, 200 nm or more but 5 μm or less.

Below the second surface 22b of the supporting plate 22, the rear surface layer 27 is provided. The supporting plate 22 is fixed to the spacer 24 by using the rear surface layer 27.

The rear surface layer 27 is, for example, a resin layer. The rear surface layer 27 is, for instance, a die attach film (DAF).

The spacer 24 is provided between the printed circuit board 20 and the supporting plate 22. The spacer 24 is fixed to the printed circuit board 20 by using the fixing layer 50.

By providing the spacer 24 between the printed circuit board 20 and the supporting plate 22, the supporting plate 22 is separated from the logic chip 10. By providing the spacer 24 between the printed circuit board 20 and the supporting plate 22, a predetermined distance can be provided between the printed circuit board 20 and the supporting plate 22 and between the logic chip 10 and the supporting plate 22, which facilitates formation of the first bonding wires 31.

The material of the spacer 24 is, for instance, a semiconductor. The material of the spacer 24 is, for example, monocrystalline silicon. The material of the spacer 24 may be, for instance, metal, ceramic, or resin.

The first memory chip 11 and the printed circuit board 20 are electrically connected by the second bonding wires 32. One end of each second bonding wire 32 is connected to the electrode pad 11b and the other end is connected to the wiring layer 20a.

The sealing resin 28 covers the logic chip 10, the first memory chip 11, the supporting plate 22, the spacer 24, and the printed circuit board 20. The sealing resin 28 is in contact with the first surface film 10a of the logic chip 10, the second surface film 11a of the first memory chip 11, and the front surface layer 26.

The sealing resin 28 has the function of protecting the logic chip 10 and the first memory chip 11. The main material of the sealing resin 28 is epoxy resin, for example. The sealing resin 28 contains a filler, for instance. The filler is a silica particle, for example.

The external terminals 60 are provided on the lower side of the printed circuit board 20. The external terminals 60 are connected to the wiring layer 20a. The external terminals 60 are, for example, solder balls.

Next, the workings and effects of the semiconductor device of the first embodiment will be described.

The semiconductor memory 100 of the first embodiment is configured as a package in which two semiconductor chips having different functions and sizes are stacked and housed. To place the logic chip 10 with a smaller size on a lower side and the first memory chip 11 with a larger size on an upper side, the supporting plate 22 and the spacer 24 are provided on the printed circuit board 20.

Figure 2:
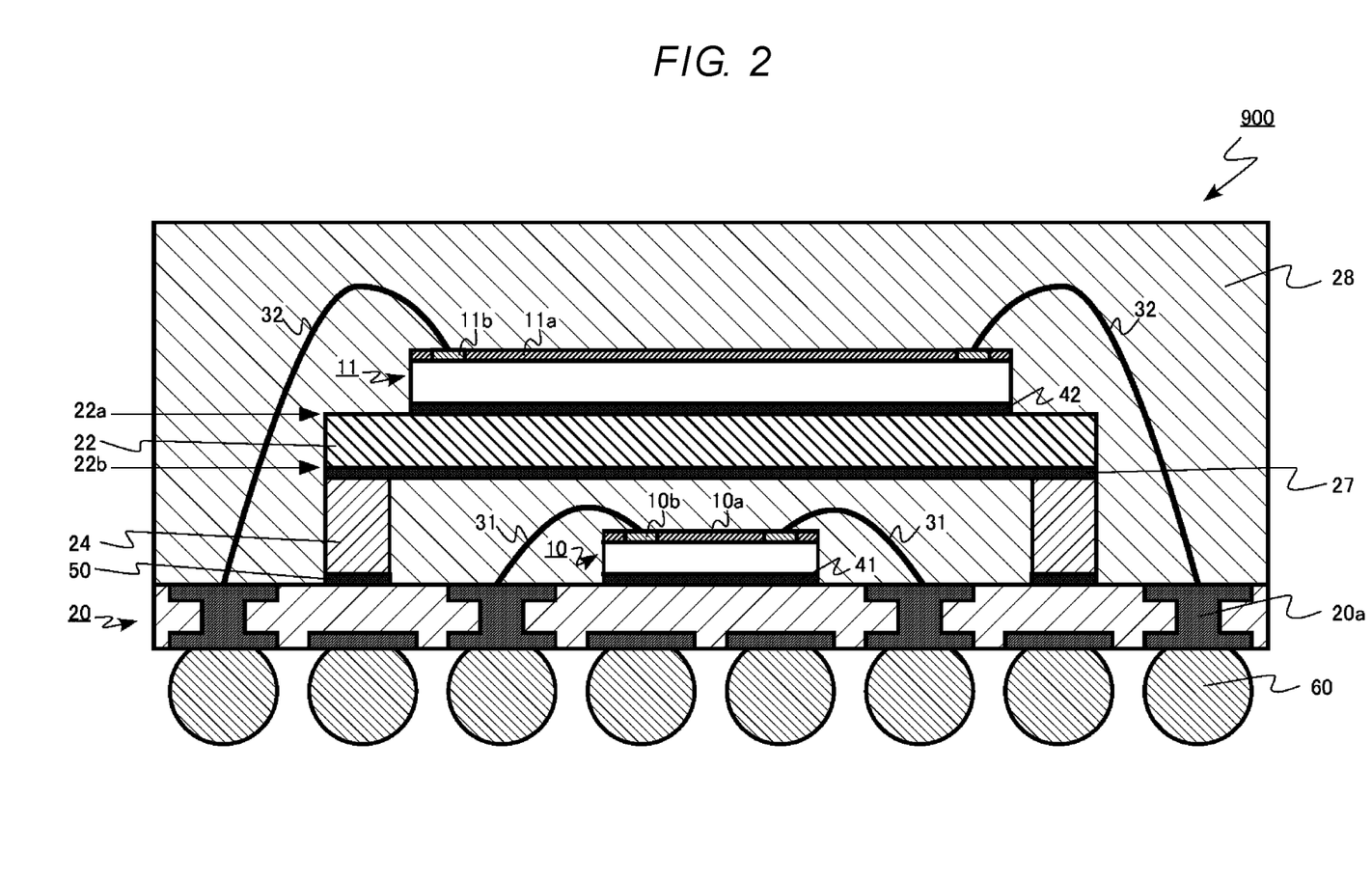
FIG. 2 is a schematic sectional view of a semiconductor device of a comparative example.

FIG. 2 is a schematic sectional view of a semiconductor device of a comparative example. The semiconductor device of the comparative example is a semiconductor memory 900.

The semiconductor memory 900 differs from the semiconductor memory 100 of the first embodiment in that the front surface layer 26 is not provided on the first surface 22a of the supporting plate 22. The first surface 22a of the supporting plate 22 is in contact with the sealing resin 28.

The material of the second surface film 11a of the first memory chip 11 is different from the material of the first surface 22a of the supporting plate 22. For example, the material of the second surface film 11a is a polyimide and the material of the first surface 22a is silicon.

The material of the sealing resin 28 is selected so as to provide good adherence both between the sealing resin 28 and the second surface film 11a of the first memory chip 11 and between the sealing resin 28 and the first surface 22a of the supporting plate 22. However, in some cases, a material that provides the sealing resin 28 with good adherence to both of the different materials does not exist.

Thus, as in the semiconductor memory 900, if the material of the second surface film 11a of the first memory chip 11 and the material of the first surface 22a of the supporting plate 22 are different from each other, there is a possibility that the adherence between the second surface film 11a and the sealing resin 28 or the adherence between the first surface 22a and the sealing resin 28 is reduced. In particular, if the material of the second surface film 11a is a polyimide or silicon nitride and the material of the first surface 22a is silicon, when the sealing resin 28 with good adherence to the second surface film 11a is selected, the adherence between the first surface 22a and the sealing resin 28 is significantly reduced.

If the adherence between the second surface film 11a and the sealing resin 28 or the adherence between the first surface 22a and the sealing resin 28 is poor, water enters the interface between the second surface film 11a and the sealing resin 28 or the interface between the first surface 22a and the sealing resin 28. The water entering the interface expands by heat which is applied in a reflowing process at the time of implementation of the semiconductor memory 900, for example. As a result of the water expanding at the interface, a crack may appear in the package. Moreover, expansion of the water at the interface may cause exfoliation of the sealing resin 28, resulting in a reduction in the humidity resistance of the semiconductor memory 900 and poor reliability.

In the semiconductor memory 100 of the first embodiment, the front surface layer 26 is provided on the first surface 22a of the supporting plate 22. The material of the front surface layer 26 is the same as the material of the second surface film 11a. Therefore, selecting the material of the sealing resin 28 so as to provide good adherence to the second surface film 11a of the first memory chip 11 also provides good adherence between the front surface layer 26 and the sealing resin 28. Thus, as compared to the semiconductor memory 900 of the comparative example, the adherence of the sealing resin 28 is improved and the appearance of a crack in a package and poor reliability can be curbed.

The material of the second surface film 11a of the first memory chip 11 is preferably a polyimide or silicon nitride. Using a polyimide or silicon nitride as the material of the second surface film 11a improves the humidity resistance of the first memory chip 11.

The first surface film 10a of the logic chip 10 and the front surface layer 26 are preferably formed of the same material. Selecting the material of the sealing resin 28 so as to provide good adherence to the front surface layer 26 also provides good adherence between the first surface film 10a and the sealing resin 28.

The rear surface layer 27 which is a resin layer is preferably provided below the second surface 22b of the supporting plate 22. Providing the rear surface layer 27 which is a resin layer eliminates the possibility of the second surface 22b being in direct contact with the sealing resin 28. Since the degree of adherence between the resin layer and the sealing resin 28 is relatively high, the adherence of the sealing resin 28 on the side of the supporting plate 22 where the second surface 22b is located is improved.

As described above, with the semiconductor memory 100 of the first embodiment, the adherence of the sealing resin is improved and the appearance of a crack in a package and poor reliability can be curbed.

Second Embodiment

A semiconductor device of a second embodiment differs from the semiconductor device of the first embodiment in that the semiconductor device of the second embodiment further includes a third semiconductor chip that is supported on the side of the supporting plate where the first surface thereof is located and has, on the front surface, a third surface film which is formed of the same material as the second surface film, the front surface layer is provided in a region between the second semiconductor chip and the third semiconductor chip, and the sealing resin is in contact with the third surface film. Hereinafter, part of the descriptions already given in the first embodiment will be omitted.

Figure 3:
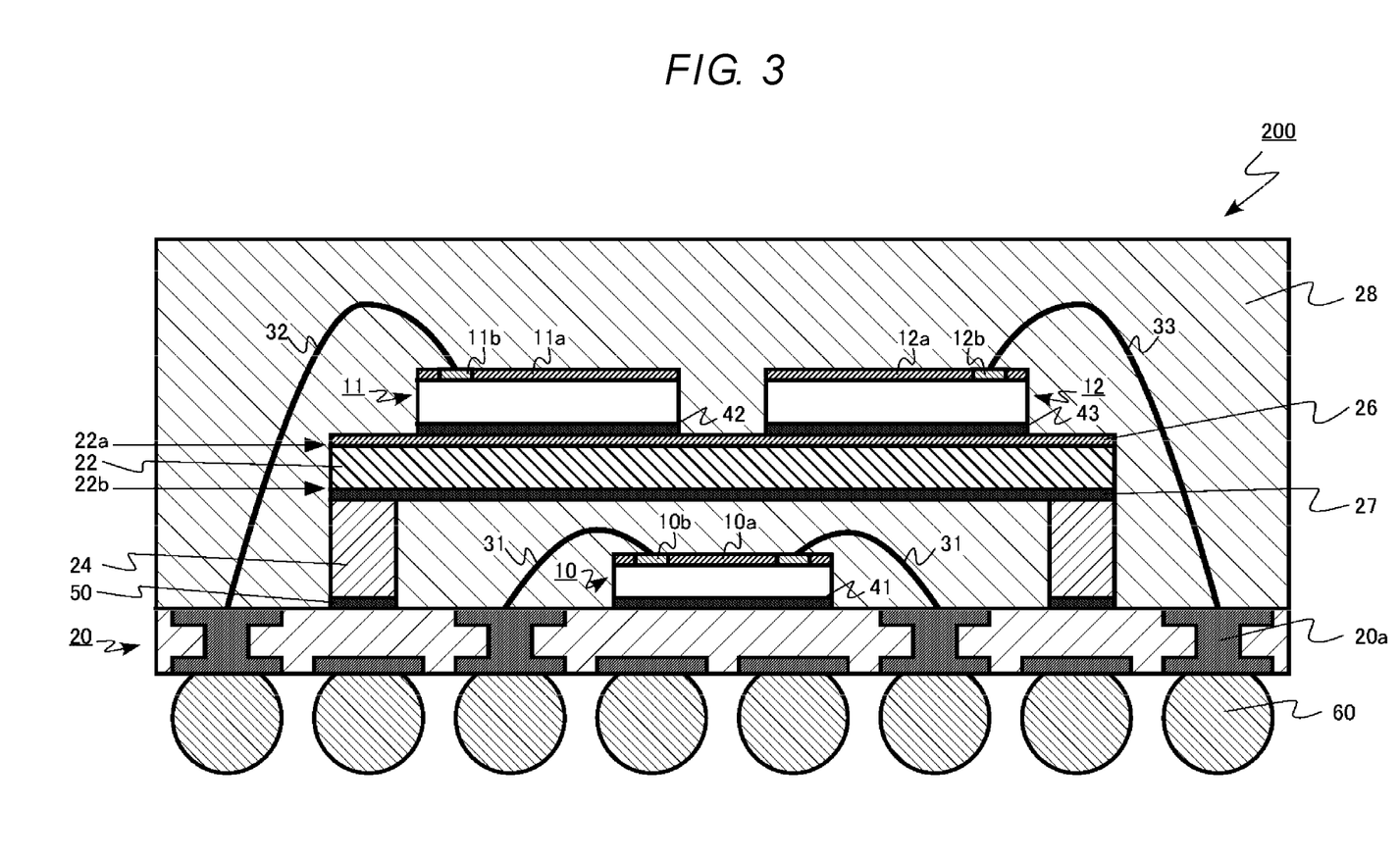
FIG. 3 is a schematic sectional view of a semiconductor device of a second embodiment.

FIG. 3 is a schematic sectional view of the semiconductor device of the second embodiment. The semiconductor device of the second embodiment is a semiconductor memory 200.

The semiconductor memory 200 includes a logic chip 10 (which may be referred to herein as the first semiconductor chip), a first memory chip 11 (which may be referred to herein as the second semiconductor chip), a second memory chip 12 (which may be referred to herein as the third semiconductor chip), a printed circuit board 20 (which may be referred to herein as the wiring board), a supporting plate 22, a spacer 24, a front surface layer 26, a rear surface layer 27, a sealing resin 28, first bonding wires 31, a second bonding wire 32, a third bonding wire 33, a first bonding layer 41, a second bonding layer 42, a third bonding layer 43, a fixing layer 50, and external terminals 60.

The semiconductor memory 200 is a multichip package (MCP) configured with three semiconductor chips housed in one package.

The first memory chip 11 is provided in such a way that the logic chip 10 is placed between the first memory chip 11 and the printed circuit board 20. The first memory chip 11 is fixed to the supporting plate 22 by using the second bonding layer 42. The first memory chip 11 has a second surface film 11a and an electrode pad 11b on the front surface.

The first memory chip 11 has a memory function. The first memory chip 11 is, for instance, a NAND flash memory. The first memory chip 11 is produced by using monocrystalline silicon, for example.

The second memory chip 12 is provided in such a way that the logic chip 10 is placed between the second memory chip 12 and the printed circuit board 20. The second memory chip 12 is provided on the side of the supporting plate 22 where a first surface 22a thereof is located. The second memory chip 12 is fixed to the supporting plate 22 by using the third bonding layer 43.

The second memory chip 12 is provided on the supporting plate 22 so as to lie side-by-side with the first memory chip 11. The second memory chip 12 has a third surface film 12a and an electrode pad 12b on the front surface.

The second memory chip 12 has a memory function. The second memory chip 12 is, for instance, a NAND flash memory. The second memory chip 12 is produced by using monocrystalline silicon, for example.

The second memory chip 12 has the same function as the first memory chip 11, for example. The second memory chip 12 may be, for instance, a semiconductor chip having a function different from the function of the first memory chip 11.

The size of the logic chip 10 is smaller than the size of the first memory chip 11 and the size of the second memory chip 12. Here, the size means a chip area.

The third surface film 12a functions as a protective film of the second memory chip 12. The third surface film 12a is an insulating film. The material of the third surface film 12a is, for example, a polyimide or silicon nitride. The material of the third surface film 12a may be, for example, other insulators such as silicon oxide. The film thickness of the third surface film 12a is, for instance, 200 nm or more but 5 μm or less.

The third surface film 12a is formed of the same material as the second surface film 11a. Moreover, the third surface film 12a is formed of the same material as the first surface film 10a, for example.

The front surface layer 26 is provided at least in a region between the first memory chip 11 and the second memory chip 12. The front surface layer 26 is provided on the first surface 22a of the supporting plate 22 between the first memory chip 11 and the second memory chip 12.

The second memory chip 12 and the printed circuit board 20 are electrically connected by the third bonding wire 33. One end of the third bonding wire 33 is connected to the electrode pad 12b and the other end is connected to the wiring layer 20a.

The sealing resin 28 covers the second memory chip 12. The sealing resin 28 is in contact with the third surface film 12a.

Next, the workings and effects of the semiconductor device of the second embodiment will be described.

In the semiconductor memory 200 of the second embodiment, the front surface layer 26 is provided on the first surface 22a of the supporting plate 22. The material of the front surface layer 26 is the same as the material of the second surface film 11a and the third surface film 12a. Thus, selecting the material of the sealing resin 28 so as to provide good adherence to the second surface film 11a of the first memory chip 11 and the third surface film 12a provides good adherence between the front surface layer 26 and the sealing resin 28.

Moreover, as a result of the semiconductor memory 200 of the second embodiment including the second memory chip 12, the semiconductor memory 200 includes three semiconductor chips. Consequently, the function of the semiconductor memory 200 is improved as compared to the semiconductor memory 100 of the first embodiment. For example, the memory capacity is increased.

As described above, with the semiconductor memory 200 of the second embodiment, the adherence of the sealing resin is improved and the appearance of a crack in a package and poor reliability can be curbed. Moreover, as a result of three semiconductor chips being included, the function of the semiconductor memory 200 is improved.

Third Embodiment

A semiconductor device of a third embodiment differs from the semiconductor device of the second embodiment in that the semiconductor device of the third embodiment further includes a fourth semiconductor chip that is provided between the supporting plate and the second semiconductor chip and supported on the side of the supporting plate where the first surface thereof is located and a fifth semiconductor chip that is provided between the supporting plate and the third semiconductor chip and supported on the side of the supporting plate where the first surface thereof is located and the distance between the fourth semiconductor chip and the fifth semiconductor chip is greater than the distance between the second semiconductor chip and the third semiconductor chip. Hereinafter, part of the descriptions already given in the second embodiment will be omitted.

Figure 4:
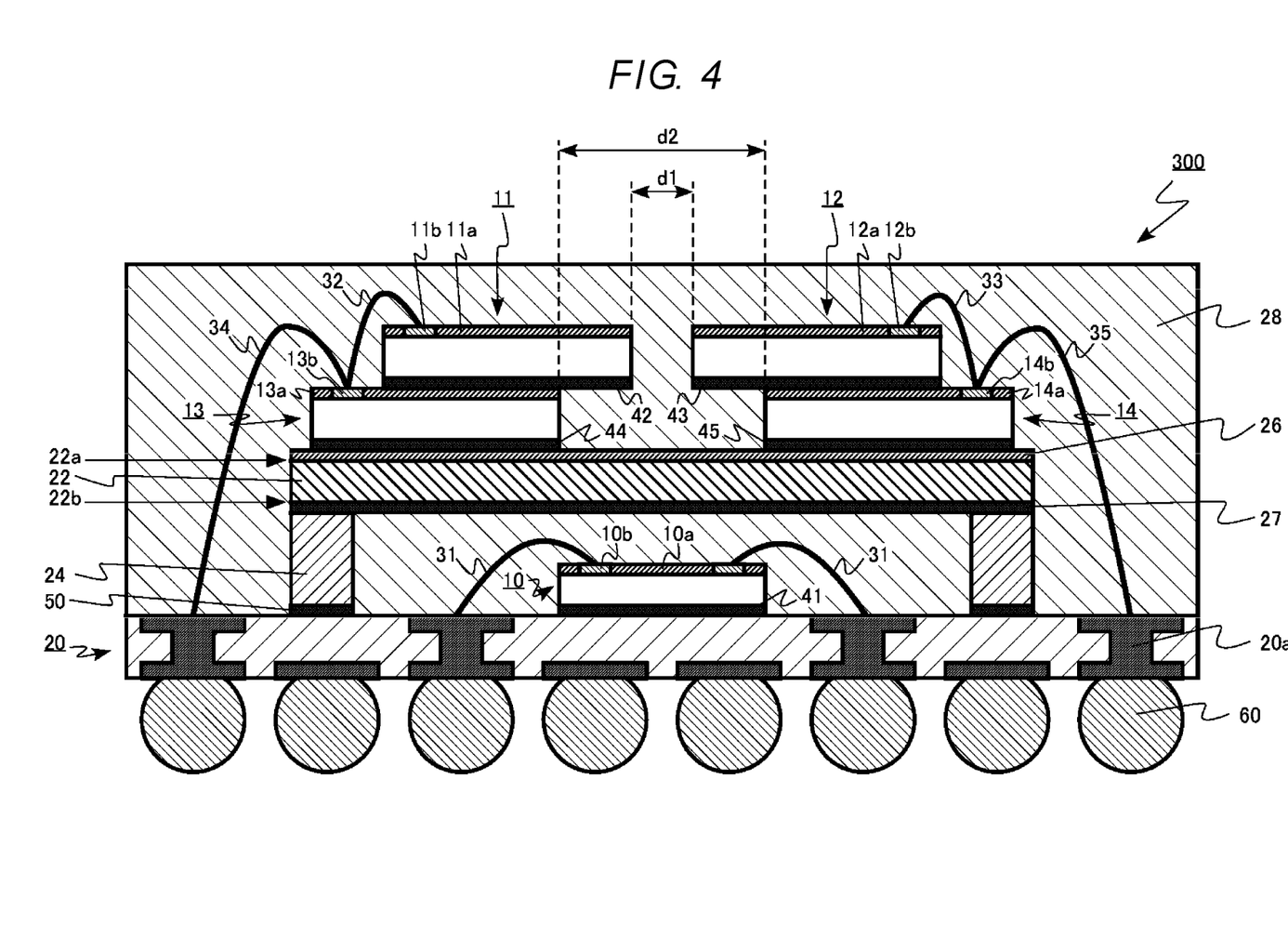
FIG. 4 is a schematic sectional view of a semiconductor device of a third embodiment.

FIG. 4 is a schematic sectional view of the semiconductor device of the third embodiment. The semiconductor device of the third embodiment is a semiconductor memory 300.

The semiconductor memory 300 includes a logic chip 10 (which may be referred to herein as the first semiconductor chip), a first memory chip 11 (which may be referred to herein as the second semiconductor chip), a second memory chip 12 (which may be referred to herein as the third semiconductor chip), a third memory chip 13 (which may be referred to herein as the fourth semiconductor chip), a fourth memory chip 14 (which may be referred to herein as the fifth semiconductor chip), a printed circuit board 20 (which may be referred to herein as the wiring board), a supporting plate 22, a spacer 24, a front surface layer 26, a rear surface layer 27, a sealing resin 28, first bonding wires 31, a second bonding wire 32, a third bonding wire 33, a fourth bonding wire 34, a fifth bonding wire 35, a first bonding layer 41, a second bonding layer 42, a third bonding layer 43, a fourth bonding layer 44, a fifth bonding layer 45, a fixing layer 50, and external terminals 60.

The semiconductor memory 300 is a multichip package (MCP) configured with five semiconductor chips housed in one package.

The first memory chip 11 is fixed on the third memory chip 13 by using the second bonding layer 42. The first memory chip 11 has a second surface film 11a and an electrode pad 11b on the front surface.

The second memory chip 12 is fixed on the fourth memory chip 14 by using the third bonding layer 43. The second memory chip 12 is provided so as to lie side-by-side with the first memory chip 11. The second memory chip 12 has a third surface film 12a and an electrode pad 12b on the front surface.

The third memory chip 13 is fixed on the supporting plate 22 by using the fourth bonding layer 44. The third memory chip 13 has a fourth surface film 13a and an electrode pad 13b on the front surface.

The fourth memory chip 14 is fixed on the supporting plate 22 by using the fifth bonding layer 45. The fourth memory chip 14 is provided so as to lie side-by-side with the third memory chip 13. The fourth memory chip 14 has a fifth surface film 14a and an electrode pad 14b on the front surface.

The distance (d2 in FIG. 4) between the third memory chip 13 and the fourth memory chip 14 is greater than the distance (d1 in FIG. 4) between the first memory chip 11 and the second memory chip 12. The distance between the third memory chip 13 and the fourth memory chip 14 is, for example, 300 μm or more but 3 mm or less. The distance between the first memory chip 11 and the second memory chip 12 is, for example, 50 μm or more but 200 μm or less.

The first memory chip 11, the second memory chip 12, the third memory chip 13, and the fourth memory chip 14 have a memory function. The first memory chip 11, the second memory chip 12, the third memory chip 13, and the fourth memory chip 14 are each a NAND flash memory, for instance. The first memory chip 11, the second memory chip 12, the third memory chip 13, and the fourth memory chip 14 are produced by using monocrystalline silicon, for example.

The fourth surface film 13a functions as a protective film of the third memory chip 13. The fourth surface film 13a is an insulating film. The material of the fourth surface film 13a is, for instance, a polyimide or silicon nitride. The material of the fourth surface film 13a may be, for example, other insulators such as silicon oxide. The film thickness of the fourth surface film 13a is, for instance, 200 nm or more but 5 µm or less.

The fifth surface film 14a functions as a protective film of the fourth memory chip 14. The fifth surface film 14a is an insulating film. The material of the fifth surface film 14a is, for example, a polyimide or silicon nitride. The material of the fifth surface film 14a may be, for instance, other insulators such as silicon oxide. The film thickness of the fifth surface film 14a is, for example, 200 nm or more but 5 µm or less.

The fourth surface film 13a and the fifth surface film 14a are formed of, for example, the same material as the second surface film 11a and the third surface film 12a. Moreover, the fourth surface film 13a and the fifth surface film 14a are formed of, for instance, the same material as the first surface film 10a.

The front surface layer 26 is provided at least in a region between the third memory chip 13 and the fourth memory chip 14. The front surface layer 26 is provided on the first surface 22a of the supporting plate 22 between the third memory chip 13 and the fourth memory chip 14.

The third memory chip 13 and the printed circuit board 20 are electrically connected by the fourth bonding wire 34. One end of the fourth bonding wire 34 is connected to the electrode pad 13b and the other end is connected to the wiring layer 20a.

The fourth memory chip 14 and the printed circuit board 20 are electrically connected by the fifth bonding wire 35. One end of the fifth bonding wire 35 is connected to the electrode pad 14b and the other end is connected to the wiring layer 20a.

One end of the second bonding wire 32 is connected to the electrode pad 11b and the other end is connected to the electrode pad 13b. The first memory chip 11 is electrically connected to the printed circuit board 20 by the second bonding wire 32 and the fourth bonding wire 34. A configuration in which the first memory chip 11 is directly connected to the printed circuit board 20 by the second bonding wire 32 may be adopted.

Moreover, one end of the third bonding wire 33 is connected to the electrode pad 12b and the other end is connected to the electrode pad 14b. The second memory chip 12 is electrically connected to the printed circuit board 20 by the third bonding wire 33 and the fifth bonding wire 35. A configuration in which the second memory chip 12 is directly connected to the printed circuit board 20 by the third bonding wire 33 may be adopted.

The sealing resin 28 covers the third memory chip 13 and the fourth memory chip 14. The sealing resin 28 is in contact with the fourth surface film 13a and the fifth surface film 14a.

Next, the workings and effects of the semiconductor device of the third embodiment will be described.

As in the case of the semiconductor memory 200 of the second embodiment, in the semiconductor memory 300 of the third embodiment, the front surface layer 26 is provided on the first surface 22a of the supporting plate 22. The material of the front surface layer 26 is the same as the material of the second surface film 11a and the third surface film 12a. Therefore, selecting the material of the sealing resin 28 so as to provide good adherence to the second surface film 11a of the first memory chip 11 provides good adherence between the front surface layer 26 and the sealing resin 28.

In the semiconductor memory 300 of the third embodiment, to connect the third memory chip 13 and the fourth memory chip 14 to the printed circuit board 20 by the bonding wires, the first memory chip 11 is stacked in such a way as to be laterally displaced with respect to the third memory chip 13. Likewise, the second memory chip 12 is stacked in such a way as to be laterally displaced with respect to the fourth memory chip 14.

As a result, the distance (d2 in FIG. 4) between the third memory chip 13 and the fourth memory chip 14 increases and the area in which the sealing resin 28 and the front surface layer 26 are in contact with each other increases. Thus, improving the adherence between the front surface layer 26 and the sealing resin 28 is especially effective from the viewpoint of curbing the appearance of a crack in a package and poor reliability.

The fourth surface film 13a and the fifth surface film 14a are preferably formed of the same material as the second surface film 11a and the third surface film 12a. The adherence between the fourth surface film 13a and the sealing resin 28 and between the fifth surface film 14a and the sealing resin 28 is improved, and the appearance of a crack in a package and poor reliability can be curbed more effectively.

Moreover, as a result of the semiconductor memory 300 of the third embodiment including the third memory chip 13 and the fourth memory chip 14, the semiconductor memory 300 includes five semiconductor chips. Consequently, the function of the semiconductor memory 300 is improved as compared to the semiconductor memory 200 of the second embodiment. For example, the memory capacity is increased.

As described above, with the semiconductor memory 300 of the third embodiment, the adherence of the sealing resin is improved and the appearance of a crack in a package and poor reliability can be curbed. Moreover, as a result of five semiconductor chips being included, the function of the semiconductor memory 300 is improved.

Fourth Embodiment

A semiconductor device of a fourth embodiment differs from the semiconductor device of the third embodiment in that the semiconductor device of the fourth embodiment further includes a silicon nitride film between the supporting plate and the front surface layer, the material of the supporting plate is silicon, and the material of the front surface layer is a polyimide. Hereinafter, part of the descriptions already given in the third embodiment will be omitted.

Figure 5:
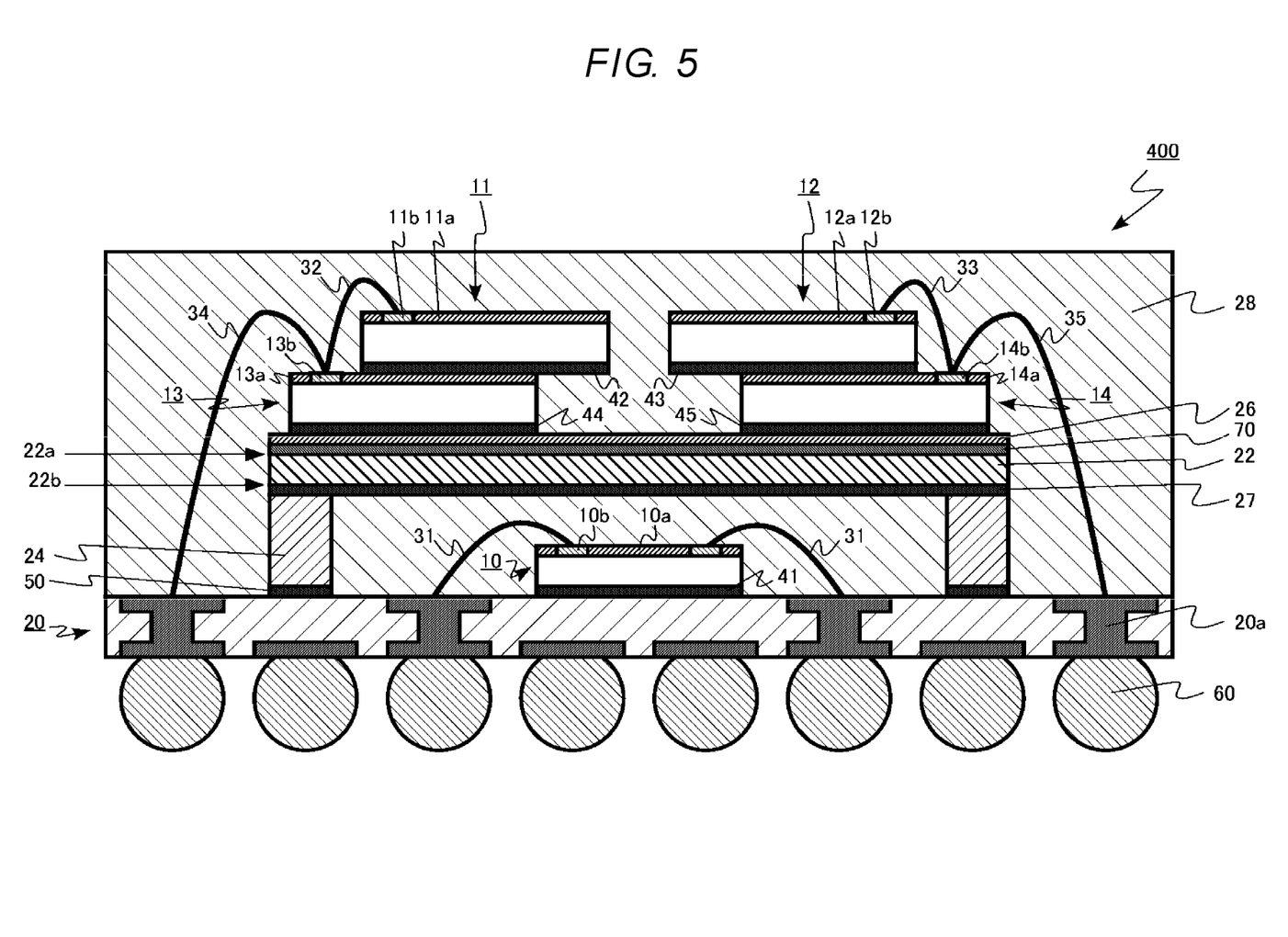
FIG. 5 is a schematic sectional view of a semiconductor device of a fourth embodiment.

FIG. 5 is a schematic sectional view of the semiconductor device of the fourth embodiment. The semiconductor device of the fourth embodiment is a semiconductor memory 400.

The semiconductor memory 400 includes a logic chip 10 (which may be referred to herein as the first semiconductor chip), a first memory chip 11 (which may be referred to herein as the second semiconductor chip), a second memory chip 12 (which may be referred to herein as the third semiconductor chip), a third memory chip 13 (which may be referred to herein as the fourth semiconductor chip), a fourth memory chip 14 (which may be referred to herein as the fifth semiconductor chip), a printed circuit board 20 (which may be referred to herein as the wiring board), a supporting plate 22, a spacer 24, a front surface layer 26, a rear surface layer 27, a sealing resin 28, first bonding wires 31, a second bonding wire 32, a third bonding wire 33, a fourth bonding wire 34, a fifth bonding wire 35, a first bonding layer 41, a second bonding layer 42, a third bonding layer 43, a fourth bonding layer 44, a fifth bonding layer 45, a fixing layer 50, external terminals 60, and a silicon nitride film 70.

The semiconductor memory 400 is a multichip package (MCP) configured with five semiconductor chips housed in one package.

The silicon nitride film 70 is provided between the supporting plate 22 and the front surface layer 26. The film thickness of the silicon nitride film 70 is, for example, 200 nm or more but 500 nm or less.

The material of the supporting plate 22 is silicon. The material of the front surface layer 26 is the same as the material of the second surface film 11*a* and the third surface film 12*a*. The material of the front surface layer 26, the second surface film 11*a*, and the third surface film 12*a* is a polyimide.

By placing the silicon nitride film 70 between silicon and a polyimide, the adherence between silicon and a polyimide is improved. Thus, exfoliation which may occur between the supporting plate 22 and the front surface layer 26 is curbed. Therefore, the reliability of the semiconductor memory 400 is improved.

As described above, with the semiconductor memory 400 of the fourth embodiment, in addition to the effects of the semiconductor memory 300 of the third embodiment, the effect of improving reliability can be obtained.

Fifth Embodiment

A semiconductor device of a fifth embodiment differs from the semiconductor device of the third embodiment in that the front surface layer covers the first surface, the second surface, and a side surface of the supporting plate. Hereinafter, part of the descriptions already given in the third embodiment will be omitted.

Figure 6:
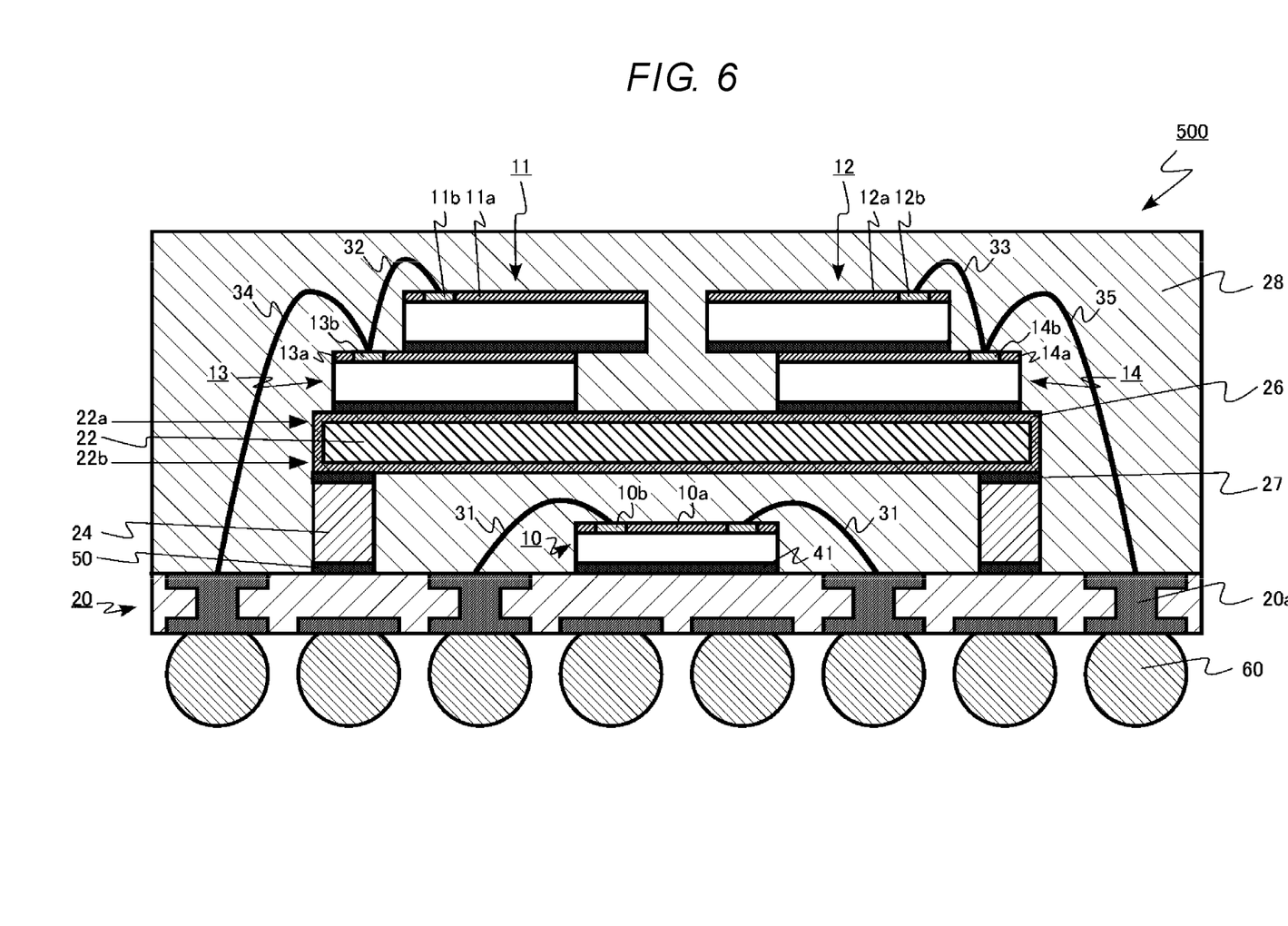
FIG. 6 is a schematic sectional view of a semiconductor device of a fifth embodiment.

FIG. 6 is a schematic sectional view of the semiconductor device of the fifth embodiment. The semiconductor device of the fifth embodiment is a semiconductor memory 500.

The semiconductor memory 500 includes a logic chip 10 (which may be referred to herein as the first semiconductor chip), a first memory chip 11 (which may be referred to herein as the second semiconductor chip), a second memory chip 12 (which may be referred to herein as the third semiconductor chip), a third memory chip 13 (which may be referred to herein as the fourth semiconductor chip), a fourth memory chip 14 (which may be referred to herein as the fifth semiconductor chip), a printed circuit board 20 (which may be referred to herein as the wiring board), a supporting plate 22, a spacer 24, a front surface layer 26, a rear surface layer 27, a sealing resin 28, first bonding wires 31, a second bonding wire 32, a third bonding wire 33, a fourth bonding wire 34, a fifth bonding wire 35, a first bonding layer 41, a second bonding layer 42, a third bonding layer 43, a fourth bonding layer 44, a fifth bonding layer 45, a fixing layer 50, and external terminals 60.

The semiconductor memory 500 is a multichip package (MCP) configured with five semiconductor chips housed in one package.

The front surface layer 26 covers a first surface 22*a*, a second surface 22*b*, and a side surface of the supporting plate 22. The front surface layer 26 covers, for example, the whole surface of the supporting plate 22.

The material of the front surface layer 26 is the same as the material of the second surface film 11*a* and the third surface film 12*a*. The material of the front surface layer 26, the second surface film 11*a*, and the third surface film 12*a* is, for instance, a polyimide or silicon nitride.

As a result of the front surface layer 26 covering the first surface 22*a*, the second surface 22*b*, and the side surface of the supporting plate 22, the adherence between the side of the supporting plate 22 where the first surface 22*a* is located and the sealing resin 28, the adherence between the side of the supporting plate 22 where the second surface 22*b* is located and the sealing resin 28, and the adherence between the side of the supporting plate 22 where the side surface is located and the sealing resin 28 are improved. Therefore, the appearance of a crack in a package and poor reliability can be curbed more effectively.

As described above, with the semiconductor memory 500 of the fifth embodiment, the appearance of a crack in a package and poor reliability can be curbed more effectively.

Sixth Embodiment

A semiconductor device of a sixth embodiment differs from the semiconductor device of the third embodiment in that the spacer covers the first semiconductor chip. Hereinafter, part of the descriptions already given in the third embodiment will be omitted.

Figure 7:
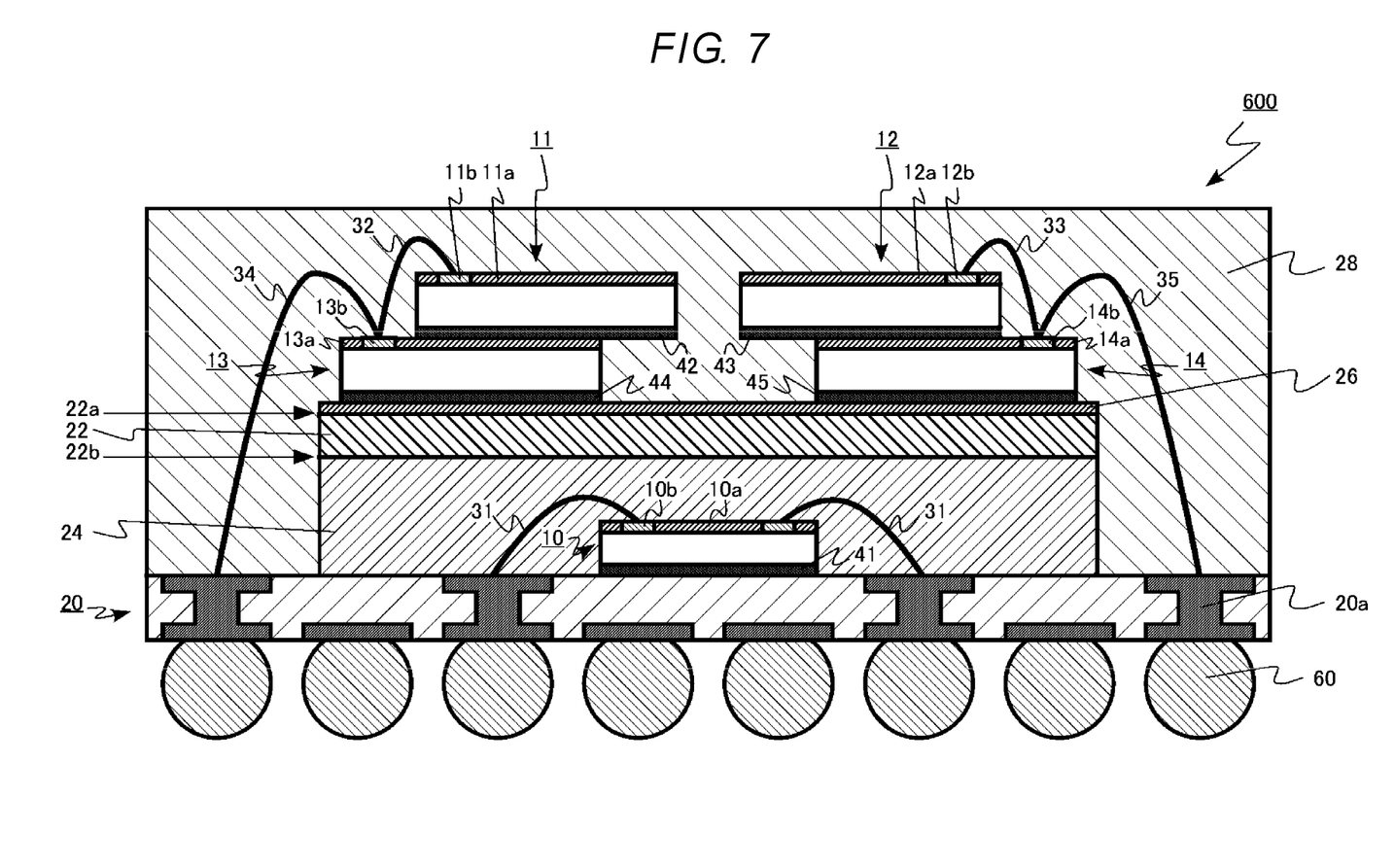
FIG. 7 is a schematic sectional view of a semiconductor device of a sixth embodiment.

FIG. 7 is a schematic sectional view of the semiconductor device of the sixth embodiment. The semiconductor device of the sixth embodiment is a semiconductor memory 600.

The semiconductor memory 600 includes a logic chip 10 (which may be referred to herein as the first semiconductor chip), a first memory chip 11 (which may be referred to herein as the second semiconductor chip), a second memory chip 12 (which may be referred to herein as the third semiconductor chip), a third memory chip 13 (which may be referred to herein as the fourth semiconductor chip), a fourth memory chip 14 (which may be referred to herein as the fifth semiconductor chip), a printed circuit board 20 (which may be referred to herein as the wiring board), a supporting plate 22, a spacer 24, a front surface layer 26, a sealing resin 28, first bonding wires 31, a second bonding wire 32, a third bonding wire 33, a fourth bonding wire 34, a fifth bonding wire 35, a first bonding layer 41, a second bonding layer 42, a third bonding layer 43, a fourth bonding layer 44, a fifth bonding layer 45, and external terminals 60.

The spacer 24 covers the logic chip 10 and the first bonding wires 31. The material of the spacer 24 is, for example, resin. The material of the spacer 24 is, for instance, resin which is different from the material of the sealing resin 28. The spacer 24 is, for example, a resin film.

As a result of the spacer 24 being provided, the supporting plate 22 is separated from the logic chip 10. For example, forming the spacer 24 as a resin film facilitates formation of the supporting plate 22 separated from the logic chip 10.

As described above, with the semiconductor memory 600 of the sixth embodiment, as in the case of the semiconductor memory of the third embodiment, the appearance of a crack in a package and poor reliability can be curbed. Moreover, as compared to the semiconductor memory of the third embodiment, the semiconductor memory 600 can be produced more easily.

The first to sixth embodiments deal with, as an example, a case in which the wiring board is the printed circuit board 20; however, the wiring board is not limited to the printed circuit board 20 as long as the wiring board is a plate-like element with a wiring layer. For instance, a silicon interposer can also be applied as the wiring board.

The first to sixth embodiments deal with, as an example, a case in which two, three, or five semiconductor chips are housed in one package; however, the number of semiconductor chips housed in a package may be 4 or 6 or more.

The first to sixth embodiments deal with, as an example, a case in which a logic chip and a memory chip are packaged as semiconductor chips; however, the types of a plurality of semiconductor chips which are packaged are not limited to particular types. For instance, different types of memory chips may be packaged or different types of logic chips may be packaged.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a wiring board;
    a first semiconductor chip that is fixed to the wiring board and includes a first surface film on a front surface thereof;
    a second semiconductor chip including a second surface film on a front surface thereof and positioned such that the first semiconductor chip is between the second semiconductor chip and the wiring board;
    a supporting plate between the first semiconductor chip and the second semiconductor chip, the supporting plate having a first surface and a second surface on a side opposite to the first surface, the second surface facing the first semiconductor chip, wherein the supporting plate supports the second semiconductor chip on a side where the first surface is located;
    a front surface layer on the first surface and formed of a same material as the second surface film;
    a spacer between the wiring board and the supporting plate; and
    a sealing resin that covers the second semiconductor chip and the supporting plate and that contacts the second surface film and contacts a front surface of the front surface layer that is opposite to a rear surface of the front surface layer facing the supporting plate.

2. The semiconductor device according to claim 1, wherein
    the first surface film and the front surface layer are formed of a same material.

3. The semiconductor device according to claim 1, further comprising:
    a third semiconductor chip that is supported on a side of the supporting plate where the first surface is located and has, on a front surface thereof, a third surface film formed of a same material as the second surface film, wherein
    the front surface layer is between the second semiconductor chip and the third semiconductor chip, and the sealing resin contacts the third surface film.

4. The semiconductor device according to claim 3, further comprising:
    a fourth semiconductor chip between the supporting plate and the second semiconductor chip and supported on a side of the supporting plate where the first surface is located; and
    a fifth semiconductor chip between the supporting plate and the third semiconductor chip and supported on a side of the supporting plate where the first surface is located, wherein
    a distance between the fourth semiconductor chip and the fifth semiconductor chip is greater than a distance between the second semiconductor chip and the third semiconductor chip.

5. The semiconductor device according to claim 1, further comprising:
    a first bonding wire that electrically connects the first semiconductor chip and the wiring board; and
    a second bonding wire that electrically connects the second semiconductor chip and the wiring board.

6. The semiconductor device according to claim 1, wherein
    a size of the first semiconductor chip is smaller than a size of the second semiconductor chip.

7. The semiconductor device according to claim 1, wherein
    a material of the front surface layer is polyimide or silicon nitride.

8. The semiconductor device according to claim 1, further comprising:
    a silicon nitride film between the supporting plate and the front surface layer, wherein
    a material of the supporting plate is silicon and a material of the front surface layer is polyimide.

9. The semiconductor device according to claim 1, wherein
    the spacer covers the first semiconductor chip.

10. The semiconductor device according to claim 9, wherein
    a material of the spacer is resin and differs from a material of the sealing resin.

11. The semiconductor device according to claim 1, wherein the sealing resin covers the first semiconductor chip and contacts the first surface film, and the first surface film and the front surface layer are formed of a same material.

12. A semiconductor device comprising:
    a wiring board;
    a first semiconductor chip that is fixed to the wiring board and includes a first surface film on a front surface thereof;
    a second semiconductor chip including a second surface film on a front surface thereof and positioned such that the first semiconductor chip is between the second semiconductor chip and the wiring board;
    a supporting plate between the first semiconductor chip and the second semiconductor chip, the supporting plate having a first surface and having a second surface on a side opposite to the first surface, the second surface facing the first semiconductor chip, wherein the supporting plate supports the second semiconductor chip in a region on a side where the first surface is located;
    a front surface layer on the first surface in a region between the first and second semiconductor chips and formed of a same material as the second surface film;

a spacer between the wiring board and the supporting plate; and a sealing resin that covers the second semiconductor chip and the supporting plate and that contacts the second surface film and contacts a front surface of the front surface layer that is opposite to a rear surface of the front surface layer facing the supporting plate.

13. The semiconductor device according to claim 12, wherein the thickness of the front surface layer is at least 200 nm and no more than 5 µm.

14. The semiconductor device according to claim 12, wherein the front surface layer is on the entire surface of the first surface.

15. The semiconductor device according to claim 12, wherein the front surface layer covers all surfaces of the supporting plate.

16. The semiconductor device according to claim 12, wherein the second surface film and the front surface layer are formed of a same material.

17. The semiconductor device according to claim 16, wherein a material of the front surface layer is polyimide or silicon nitride.

* * * * *